(12) United States Patent
Wang et al.

(10) Patent No.: US 10,396,246 B2
(45) Date of Patent: Aug. 27, 2019

(54) OPTOELECTRONIC DEVICE AND METHOD FOR MANUFACTURING THE SAME

(71) Applicant: EPISTAR CORPORATION, Hsinchu (TW)

(72) Inventors: Jia-Kuen Wang, Hsinchu (TW); Chao-Hsing Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 13 days.

(21) Appl. No.: 15/437,438

(22) Filed: Feb. 20, 2017

(65) Prior Publication Data

US 2017/0162751 A1 Jun. 8, 2017

Related U.S. Application Data

(63) Continuation of application No. 14/591,772, filed on Jan. 7, 2015, now Pat. No. 9,601,655.

(30) Foreign Application Priority Data

Jan. 7, 2014 (TW) .............................. 103100593 A (51) Int. Cl.
*H01L 33/38* (2010.01)
*H01L 33/00* (2010.01)
(Continued)

(52) U.S. Cl.
CPC ........ *H01L 33/382* (2013.01); *H01L 25/0753* (2013.01); *H01L 33/007* (2013.01); *H01L 33/0062* (2013.01); *H01L 33/0075* (2013.01); *H01L 33/0083* (2013.01); *H01L 33/0095* (2013.01); *H01L 33/36* (2013.01); *H01L 33/385* (2013.01); *H01L 33/405* (2013.01); *H01L 33/44* (2013.01); *H01L 33/56* (2013.01); *H01L 33/58* (2013.01); *H01L 33/60* (2013.01); *H01L 33/62* (2013.01); *H01L 33/641* (2013.01);
(Continued)

(58) Field of Classification Search
CPC ............... H01L 33/0062; H01L 33/007; H01L 33/0075; H01L 33/0083; H01L 33/36; H01L 33/385; H01L 33/387
See application file for complete search history.

(56) References Cited

U.S. PATENT DOCUMENTS

2009/0121241 A1* 5/2009 Keller .................. H01L 33/385
257/96
2010/0051987 A1 3/2010 Katsuno et al.
(Continued)

FOREIGN PATENT DOCUMENTS

CN 102738331 A 10/2012

*Primary Examiner* — Phat X Cao
(74) *Attorney, Agent, or Firm* — Patterson + Sheridan, LLP (57) ABSTRACT

An optoelectronic device includes a semiconductor stack, including a first semiconductor layer, an active layer formed on the first semiconductor layer, and a second semiconductor layer; a first metal layer formed on a top surface of the second semiconductor layer; a second metal layer formed on a top surface of the first semiconductor layer; an insulative layer formed on the top surface of the first semiconductor layer and the top surface of the second semiconductor layer; wherein a space between a sidewall of the first metal layer and a sidewall of the semiconductor stack is less than 3 μm.

8 Claims, 7 Drawing Sheets

(51) Int. Cl.
  *H01L 33/36* (2010.01)
  *H01L 33/40* (2010.01)
  *H01L 33/44* (2010.01)
  *H01L 25/075* (2006.01)
  *H01L 33/56* (2010.01)
  *H01L 33/58* (2010.01)
  *H01L 33/60* (2010.01)
  *H01L 33/62* (2010.01)
  *H01L 33/64* (2010.01)
  *F21K 9/232* (2016.01)
  *F21Y 115/10* (2016.01)
  *F21V 23/06* (2006.01)

(52) U.S. Cl.
  CPC .............. *F21K 9/232* (2016.08); *F21V 23/06* (2013.01); *F21Y 2115/10* (2016.08); *H01L 2224/48091* (2013.01); *H01L 2224/73265* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 2011/0163346 A1 | 7/2011 | Seo et al. |
| 2011/0272666 A1* | 11/2011 | Hung ............... H01L 33/22 257/13 |
| 2013/0134867 A1 | 5/2013 | Yang et al. |
| 2013/0146915 A1 | 6/2013 | Huang et al. |
| 2013/0248915 A1* | 9/2013 | Shimada ............ H01L 33/007 257/99 |
| 2013/0264600 A1 | 10/2013 | Lee et al. |
| 2014/0054636 A1* | 2/2014 | Anzue ............... H01L 33/32 257/98 |

* cited by examiner

OPTOELECTRONIC DEVICE AND METHOD FOR MANUFACTURING THE SAME

CROSS REFERENCE TO RELATED APPLICATION

This application is a continuation of co-pending application Ser. No. 14/591,772, filed on Jan. 7, 2015, for which priority is claimed under 35 U.S.C. § 120; and this application claims priority of TW Application Serial No. 103100593, filed on Jan. 7, 2014 under 35 U.S.C. § 119, and the contents of which are hereby incorporated by reference in their entireties.

BACKGROUND

Technical Field

The application relates to an optoelectronic device, and more particularly, to an optoelectronic device having improved electrode design.

Description of the Related Art

The light radiation theory of light emitting diode (LED) is to generate light from the energy released by the recombination of the carriers between an n-type semiconductor and a p-type semiconductor. Because the light radiation theory of LED is different from that of the incandescent light which heats the filament, the LED is called a "cold" light source. Moreover, the LED is more sustainable, longevous, light and handy, and less power-consumption, therefore it is considered as an alternative light source in the illumination markets. The LED applies to various applications like the traffic signals, backlight modules, street lights, and medical instruments, and is gradually replacing the traditional lighting sources.

Figure 1A:
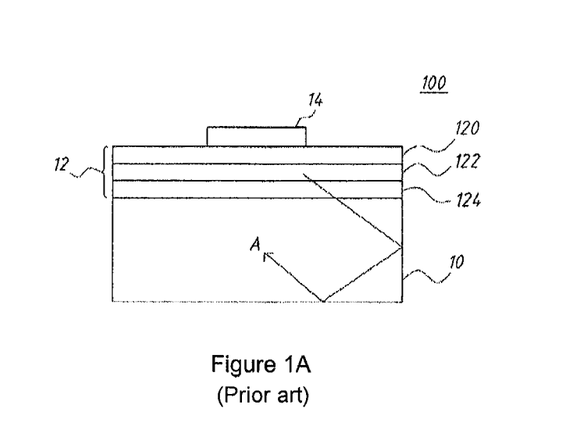
FIGS. 1A-1B show cross-sectional views of a conventional optoelectronic device array.

FIG. 1A shows the structure of a conventional optoelectronic device. As FIG. 1A shows, a light emitting device 100 which includes a transparent substrate 10, a semiconductor stack 12 formed above the transparent substrate 10, and an electrode 14 formed above the semiconductor stack 12, wherein the semiconductor stack 12 includes, from the top, a first conductive-type semiconductor layer 120, an active layer 122, and a second conductive-type semiconductor layer 124.

Figure 1B:
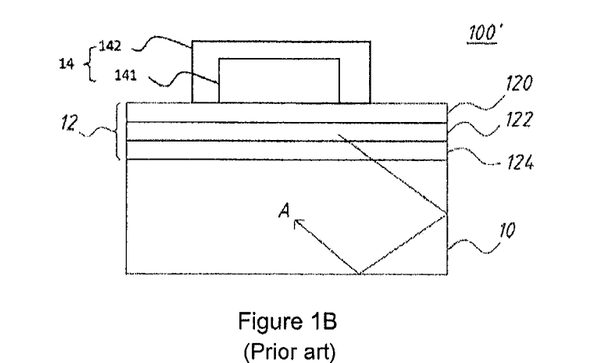

FIG. 1B shows the structure of a conventional optoelectronic device. As FIG. 1B shows, the light emitting device 100 includes a transparent substrate 10, a semiconductor stack 12 formed above the transparent substrate 10, and an electrode 14 formed above the semiconductor stack 12, wherein the electrode 14 includes a reflective electrode 141 and a diffusion barrier layer 142. The diffusion barrier may disadvantage reflectivity. Therefore the light extraction efficiency of the light emitting device 100 is reduced.

Figure 2:
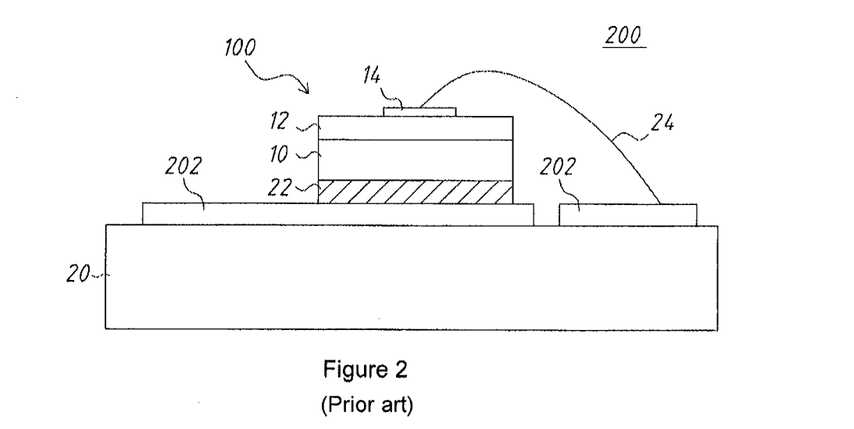
FIG. 2 shows a structural view of a conventional optoelectronic device.

Moreover, the light emitting device 100 may be further connected to other components in order to form a light emitting apparatus. FIG. 2 shows the structure of a conventional light emitting apparatus. As FIG. 2 shows, the light emitting apparatus 200 includes a sub-mount 20 carrying an electrical circuit 202, a solder 22 formed above the sub-mount 20; wherein the light emitting device 100 is bonded to the sub-mount 20 and a substrate 10 of the light emitting device 100 is electrically connected with the electric circuit 202 on the sub-mount 20 by the solder 22, and an electrical connection structure 24 that electrically connects the electrode 14 of the light emitting device 100 to the electric circuit 202 on the sub-mount 20, wherein the sub-mount 20 may be lead frame or large size mounting substrate in order to facilitate circuit design and heat dissipation.

SUMMARY OF THE DISCLOSURE

An optoelectronic device includes a semiconductor stack, wherein the semiconductor stack includes a first semiconductor layer, an active layer formed on the first semiconductor layer, and a second semiconductor layer formed on the active layer; an electrode formed on the second semiconductor layer, wherein the first electrode further includes a reflective layer; and an insulative layer formed on the second semiconductor layer, and a space formed between the first electrode and the insulative layer.

An optoelectronic device includes a semiconductor stack, including a first semiconductor layer, an active layer formed on the first semiconductor layer, and a second semiconductor layer; a first metal layer formed on a top surface of the second semiconductor layer; a second metal layer formed on a top surface of the first semiconductor layer; an insulative layer formed on the top surface of the first semiconductor layer and the top surface of the second semiconductor layer; wherein the first metal layer includes a first top surface, the second metal layer includes a second top surface, and the insulative layer includes a third top surface and a fourth top surface, wherein a first height difference between a height from the first top surface of the first metal layer to the top surface of the second semiconductor layer and a height from the third top surface of the insulative layer to the top surface of the second semiconductor layer is less than 1 μm.

An optoelectronic device includes a semiconductor stack, including a first semiconductor layer, an active layer formed on the first semiconductor layer, and a second semiconductor layer; a first metal layer formed on a top surface of the second semiconductor layer; a second metal layer formed on a top surface of the first semiconductor layer; an insulative layer formed on the top surface of the first semiconductor layer and the top surface of the second semiconductor layer; wherein a space between a sidewall of the first metal layer and a sidewall of the semiconductor stack is less than 3 μm.

DETAILED DESCRIPTION OF THE EMBODIMENTS

In order to make the features and advantages of the present application more comprehensible, the present application is further described in detail in the following with reference to the embodiments and the accompanying drawings from FIG. 3A to FIG. 6.

FIGS. 3A-3E show a manufacturing process of an optoelectronic device in accordance with the first embodiment.

Figure 3A:
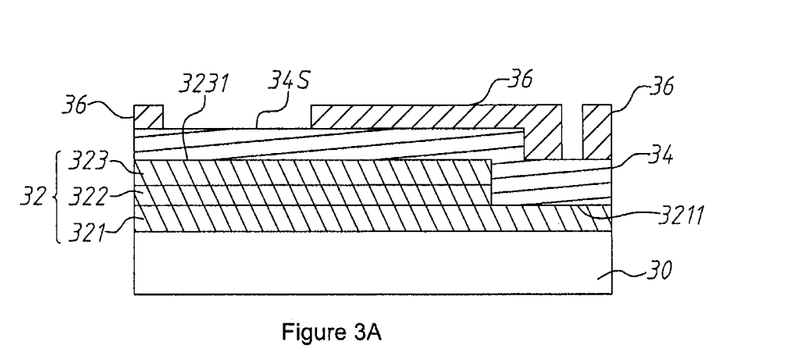
FIGS. 3A-3E show a manufacturing process in accordance with one embodiment of present disclosure.

As shown in FIG. 3A, a substrate 30 is provided, a semiconductor stack 32 is formed on the substrate 30, wherein the semiconductor stack 32 includes a first conductive semiconductor layer 321, an active layer 322, and a second conductive semiconductor layer 323 formed on the substrate 30.

Next, an insulative layer 34 is formed on and directly contacts a first surface 3211 of the first conductive semiconductor layer 321 and a first surface 3231 of the second conductive semiconductor layer 323. After that, a patterned photoresist layer 36 is formed on a portion of a first surface 34S of the insulative layer 34. A portion of the first surface 34S of the insulative layer 34 is thus exposed.

Figure 3B:
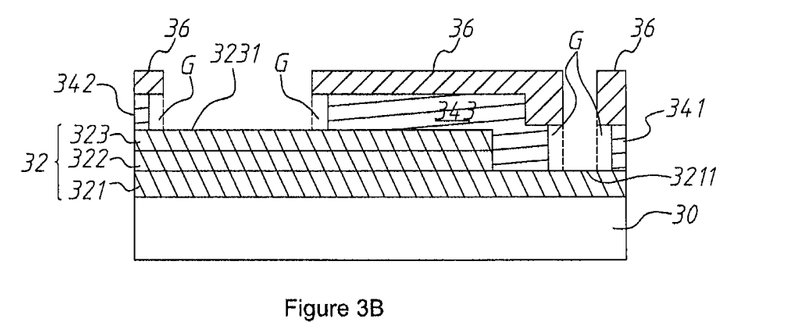

As shown in FIG. 3B, an etching process is performed to remove a portion of the insulative layer 34 by the patterned photoresist layer 36 and expose a portion of the first surface 3211 of the first conductive semiconductor layer 321 and a portion of the first surface 3231 of the second conductive semiconductor layer 323 to form a first insulative layer 341 on a portion of the first surface 3211 of the first conductive semiconductor layer 321, a second insulative layer 342 on a portion of the first surface 3231 of the second conductive semiconductor layer 323, and a third insulative layer 343 on a portion of the first surface 3211 of the first conductive semiconductor layer 321 and a portion of the first surface 3231 of the second conductive semiconductor layer 323.

In one embodiment, by performing side etching process on the insulative layer 34 with the patterned photoresist layer 36, a portion of unexposed insulative layer 34 is removed so as to make a portion of the first insulative layer 341 and the second insulative layer 342 having an undercut pattern in accordance with the patterned photoresist layer 36. The distances between an edge projected by the patterned photoresist layer 36 on the semiconductor stack 32 and an edge projected by the first insulative layer 341 on the semiconductor stack 32, and also the distances between an edge projected by the patterned photoresist layer 36 on the semiconductor stack 32 and an edge projected by the second insulative layer 342 on the semiconductor stack 32 are G. In one embodiment, the distance G can be less than 3 μm. In one embodiment, the side etching process can be a wet etching.

Figure 3C:
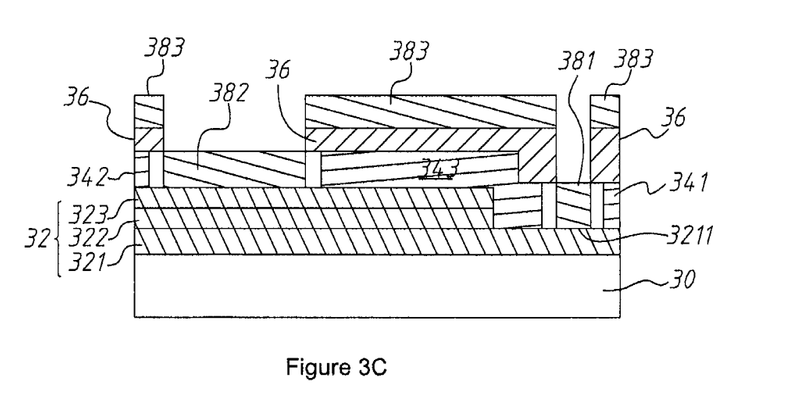

Next, as shown in FIG. 3C, a first metal layer 382, a second metal layer 381, and a temporary metal layer 383 are formed by a physical vapor deposition (PVD) process. The first metal layer 382 is formed on an exposed portion of the first surface 3231 of the second conductive semiconductor layer 323; the second metal layer 381 is formed on an exposed portion of the first surface 3211 of the first conductive semiconductor layer 321; the temporary metal layer 383 is formed on the patterned photoresist layer 36 and covers an upper surface of the patterned photoresist layer 36. In one embodiment, the physical vapor position can be vacuum evaporation, sputtering, electron beam evaporation, or ion plating.

In one embodiment, due to the undercut pattern of the patterned photoresist layer 36, a side wall of the first metal layer 382 may not directly contact a side wall of the second insulative layer 342 and a side wall of the third insulative layer 343, and also a side wall of the second metal layer 381 may not directly contact a side wall of first insulative layer 341 and the side wall of the third insulative layer 343.

In one embodiment, the first metal layer 382 can be multiple layers including a reflective layer. In one embodiment, the reflective layer can be made of materials with reflectivity over 90%. In one embodiment, the reflective layer can be made of materials selected from Cr, Ti, Ni, Pt, Cu, Au, Al, W, Sn, and Ag.

Figure 3D:
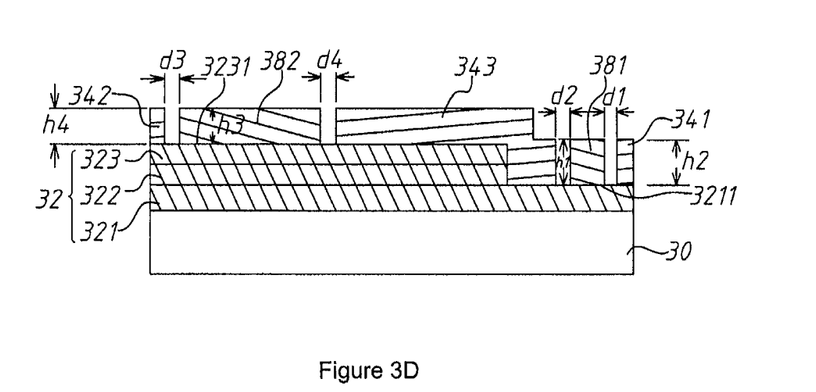

Next, as shown in FIG. 3D, the patterned photoresist layer 36 and the temporary metal layer 383 formed above are removed. In one embodiment, as shown in FIG. 3D, a height from a top surface of the second metal layer 381 to the first surface 3211 of the first conductive semiconductor layer 321 is h1; a height from a top surface of the first insulative layer 341 to the first surface 3211 of the first conductive semiconductor layer 321 is h2. By performing the manufacturing process disclosed in the embodiments of the present application, the difference between h1 and h2 can be less than 1 μm. In one embodiment, a distance between second metal layer 381 and the first insulative layer 341 is d1, wherein d1 is less than 3 μm, and/or a distance between first metal layer 381 and the third insulative layer 343 is d2, wherein d2 is less than 3 μm. In one embodiment, d1 is equal to d2.

In one embodiment, a height from a top surface of the first metal layer 382 to the second surface 3231 of the second conductive semiconductor layer 323 is h3, and a height from a top surface of the second insulative layer 342 to the second surface 3231 of the second conductive semiconductor layer 323 is h4. By performing the manufacturing process disclosed in the embodiments of the present application, the difference between h3 and h4 can be less than 1 μm. In one embodiment, a distance between the first metal layer 382 and the second insulative layer 342 is d3, wherein d3 is less than 3 μm, and/or a distance between the first metal layer 382 and the third insulative layer 343 is d4, wherein d2 is less than 3 μm. In one embodiment, d3 is equal to d4. In another embodiment, d1, d2, d3, and d4 are equal.

Figure 3E:
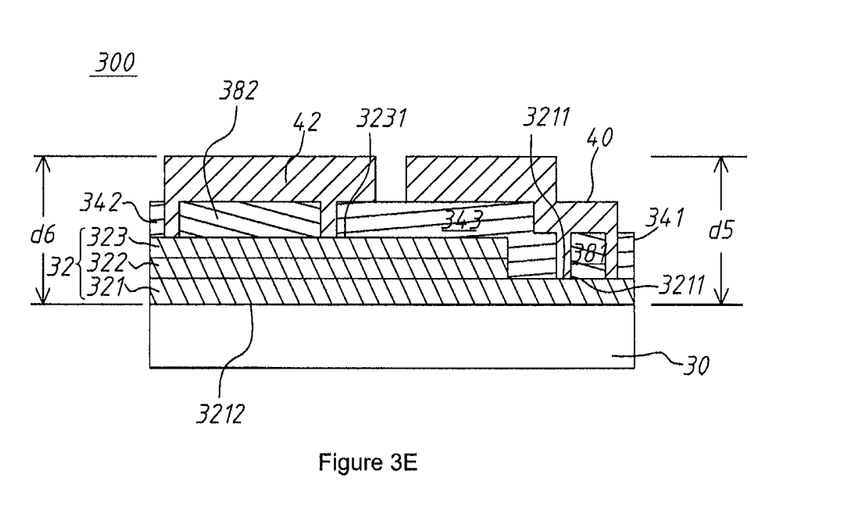

Finally, as shown in FIG. 3E, a third metal layer 42 is formed on the first metal layer 382 and a fourth metal layer 40 is formed on the second metal layer 381 so the optoelectronic device 300 is formed. In one embodiment, a portion of the fourth metal layer 40 directly contacts the first surface 3211 of the first conductive semiconductor layer 321, or a portion of the third metal layer 42 directly contacts the first surface 3231 of the second conductive semiconductor layer 323. In one embodiment, the second insulative layer 342 is barely found under the third metal layer 42. In one embodiment, a distance between a top surface of the third metal layer 42 and a second surface 3212 of the first conductive semiconductor layer 321 is d6, and a distance between a top surface of the fourth metal layer 40 and a second surface 3212 of the first conductive semiconductor layer 321 is d5, wherein the difference between d6 and d5 is less than 1 μm. In one embodiment, a projected area of the third metal layer 42 and a projected area of the fourth metal layer 40 onto the substrate 30 can be of similar size.

In one embodiment, following the process described in FIG. 3D or FIG. 3E, the substrate 30 can be removed to expose a portion of the second surface 3212 of the first conductive semiconductor layer 321 so a thin-film flip chip is formed. In one embodiment, following the process described in FIG. 3D or FIG. 3E, the optoelectronic device 300 is connected to a sub-mount (not shown) through the first metal layer 382, the second metal layer 381, the third metal layer 42, and the fourth metal layer 42 to form a flip chip package. In one embodiment, a material of the first metal layer 382, the second metal layer 381, the third metal layer 42, and the fourth metal layer 40 are metal materials including: Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, and Ge—Au—Ni.

Figure 4A:
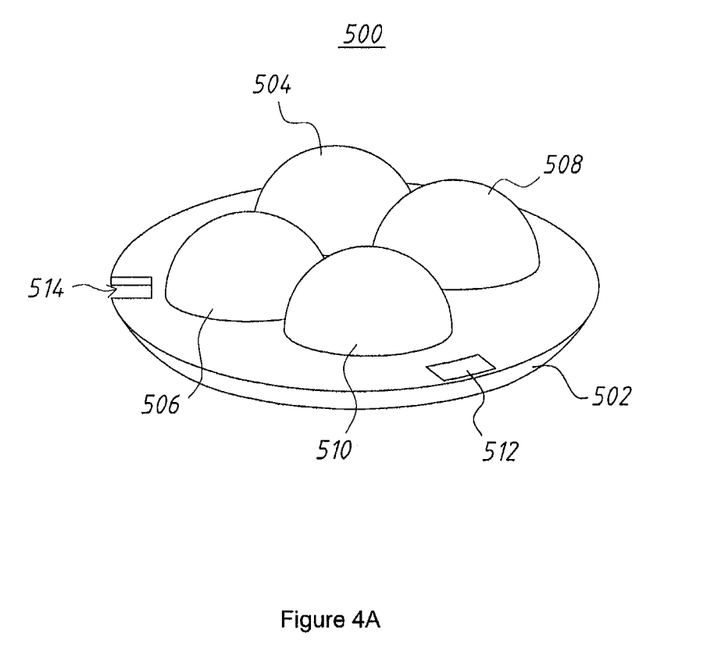
FIGS. 4A-4C show a perspective view of a light-emitting module disclosed in the present disclosure.
Figure 4B:
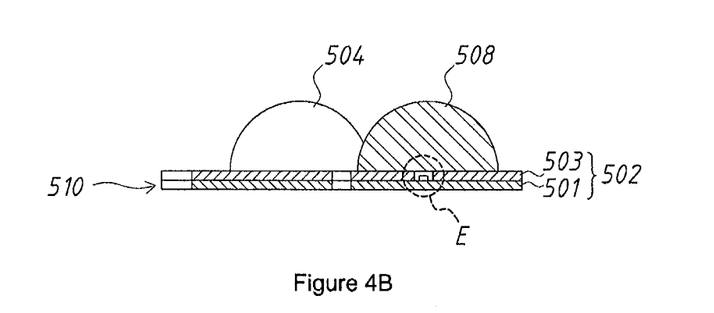
Figure 4C:
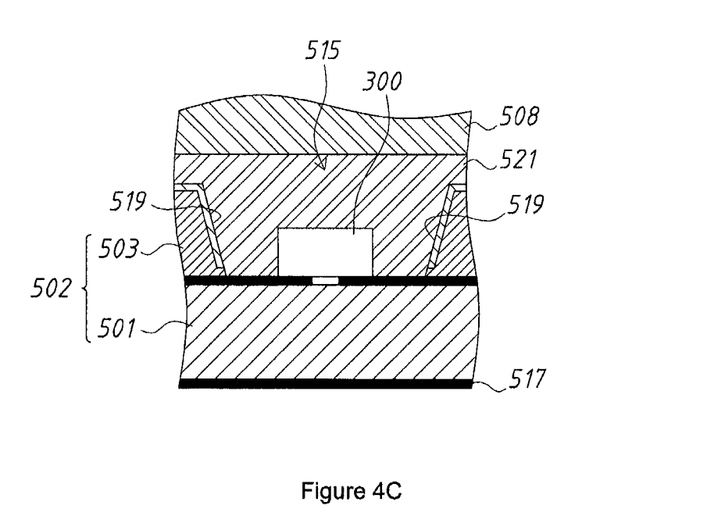

FIGS. 4A-4C show a light emitting module disclosed in the embodiments of the present application. FIG. 4A shows a perspective view of the light emitting module 500 including a carrier 502, a plurality of lenses 504, 506, 508, and 510, and two power supply terminals 512 and 514. FIG. 4B shows a cross-sectional view of the light emitting module and FIG. 4C is an enlarged view of a region E of FIG. 4B. The carrier 502 includes an upper carrier 503 and a lower carrier 501, wherein a surface of the lower carrier 501 can contact the upper carrier 503. The lens 504 and lens 508 are formed above the upper carrier 503. A through hole 515 can be formed on the upper carrier 503. The optoelectronic device 300 disclosed in the embodiments of the present application can be formed in the through hole 515, contact the lower carrier 501, and be surrounded by adhesive material 521. The lens 508 is formed on the adhesive material 521.

As shown in FIG. 4C, in one embodiment, a reflective layer 519 can be formed on a side wall of the through hole 515 to enhance light extraction; a metal layer 517 can be formed on a lower surface of the lower carrier 501 to enhance heat dissipating efficiency.

Figure 5A:
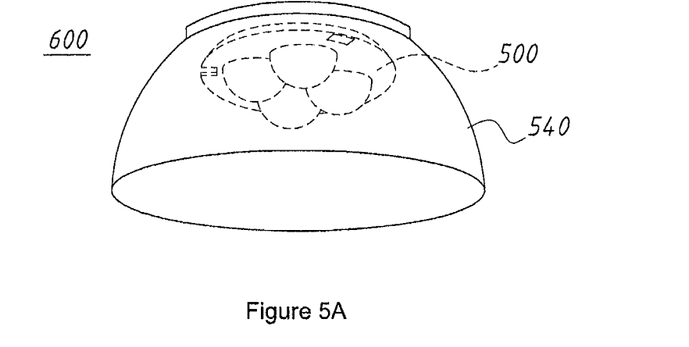
FIGS. 5A-5B show a perspective view of a light source generating device disclosed in the present disclosure.
Figure 5B:
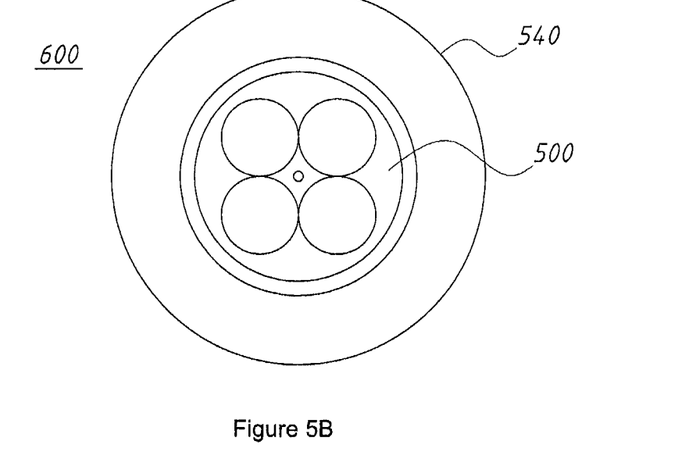

FIGS. 5A-5B show a view of a light source generating device 600. The light source generating device 600 includes a lighting module 500, a shell 540, a power supply system (not shown) to supply the light source generating device 600 with a current, and a control device (not shown) to control the power supply system (not shown). The light source generating device 600 can be a lighting apparatus such as road lamps, automotive lightings or indoor lightings. It can also be traffic lightings and light sources of backlight modules of flat panel displays.

Figure 6:
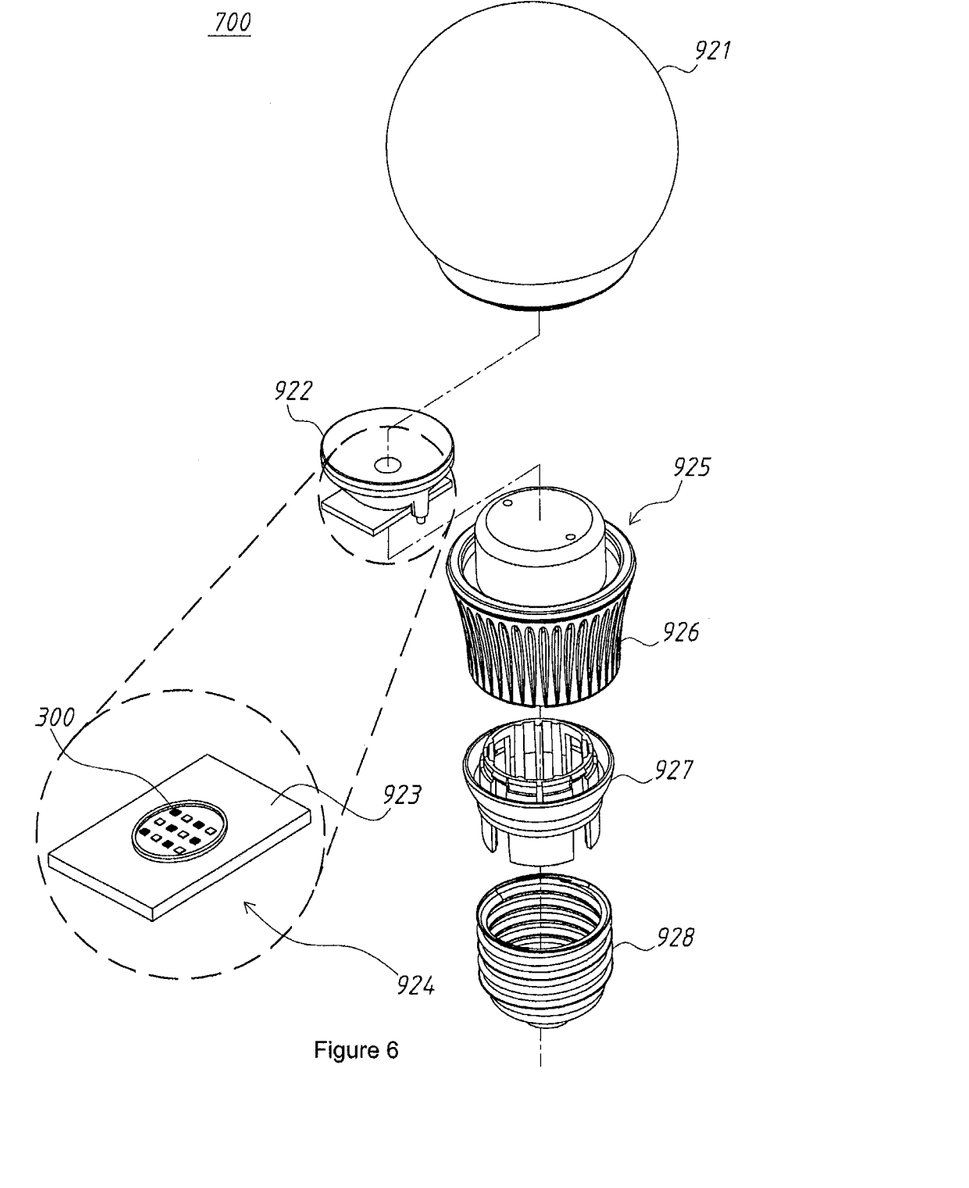
FIG. 6 shows a perspective view of a light bulb disclosed in the present disclosure.

FIG. 6 shows a view of a light bulb. A light bulb 700 includes a shell 921, a lens 922, a lighting module 924, a stand 925, a heat dissipater 926, a connector 927 and an electrical connector 928, wherein the lighting module 924 includes a supporter 923 having an optoelectronic device 300 disclosed in any one of the embodiments in present disclosure.

Specifically, the optoelectronic device 300 can be at least one of those devices including a light emitting diode (LED), a photodiode, a photoresistor, a laser, an infrared emitter, an organic light-emitting diode, or a solar cell. The substrate 30 serves as a growing and/or bearing base, which may be a conductive substrate or an insulative substrate, a transparent substrate or an opaque substrate, wherein the conductive substrate may be made of materials such as Ge, GaAs, InP, SiC, Si, $LiAlO_2$, ZnO, GaN, AlN, and metal; the transparent substrate may be made of materials such as sapphire, $LiAlO_2$, ZnO, GaN, glass, diamond, CVD diamond, Diamond-Like Carbon (DLC), spinel ($MgAl_2O_4$), $Al_2O_3$, $SiO_x$, and $LiGaO_2$.

The first conductive type semiconductor layer 321 and the second conductive type semiconductor layer 323 may be made of materials with different electrical properties, polarities, or dopants to provide a single layer or multiple layers (the "multiple layers" means two or more layers as hereinafter mentioned). The electrical properties of those semiconductor layers can be a combination of at least two of p-type, n-type, and i-type. The active layer 322 may be made of material which is different electrical properties, polarities, or dopants from the first conductive type semiconductor layer 321 and the second conductive semiconductor layer 322 to provide electrons and holes between semiconductor materials and is a region where electric energy and optical energy may convert or be converted to each other. The application of converting electric energy to optical energy can be light emitting diodes, liquid crystal displays, and organic light emitting diodes; the application of converting optical energy to electric energy can be solar cells and photodiode. The semiconductor stack 32 can be materials including one or more elements selected from a group consisting of Ga, Al, In, As, P, N and Si, wherein the known materials are group III-V semiconductor such as AlGaInP series material, AlGaInN series material, and other series material such as ZnO. The structure of the active layer 322 may be a single heterostructure (SH), double heterostructures, (DH), double-side double heterostructures (DDH), or multi-quantum wells (MQW). When the optoelectronic device 300 is a light emitting element, the wavelength can be changed by adjusting the physical or chemical elements of the single or multiple semiconductor layers. Furthermore, adjusting pairs of quantum well can also change the wavelength.

In one embodiment, a buffer layer (not shown) may be optionally formed between the semiconductor epitaxial layer 32 and the substrate 30. The material of the buffer layer is between two material systems to transit the material system of the substrate 30 to the material system of the semiconductor epitaxial layer 32. For the structure of the light emitting diode, on one hand, the buffer layer can reduce lattice mismatch between two materials; on the other hand, the buffer layer can bond together two materials or two separated structures such as single layers, multiple layers or structures, wherein the material of the buffer layer may be organic material, inorganic material, metal, or semiconductor, wherein the structure of the buffer layer may be reflective layers, heat dissipation layers, conductive layers, ohmic contact layers, anti-deformation layers, stress release layers, stress adjustment layers, bonding layers, wavelength conversion layers, or mechanical fixation structures.

A contact layer may be further optionally formed on the semiconductor epitaxial layer 32. The contact layer is arranged on the side of the semiconductor epitaxial layer 32 away from the substrate 30. The contact layer may be an optical layer, an electrical layer, or the combination thereof. The optical layer may change the radiation or light coming in or out from the active layer. The so-called "change" means to alter at least one of the optical characteristics of the radiation or light. These characteristics include but are not limited to frequency, wavelength, intensity, flux, efficiency, color temperature, rendering index, light field, and angle of view. The electrical layer may change or incline to change at least one numerical value of the voltage, resistance, current, capacity measured between any combinations of the contact layers. The material of the contact layer includes oxide, conductive oxide, transparent oxide, oxide with no less than 50% transmittance, or metal, relatively transparent metal, transparent metal with no less than 50% transmittance, organic, inorganic, fluorescence, phosphorescence, ceramic materials, semiconductor, doped semiconductor, or undoped semiconductor. In certain applications, the material of the contact layer may be one of the materials such as InTiO, CdSnO, SbSnO, InZnO, ZnAlO or ZnSnO. If the material of the contact layer is relatively transparent metal, the thickness of the contact layer is in a range between 0.005 μm to 0.6 μm. In one embodiment, because the contact layer has better lateral current diffusion rate, it may be used to spread the current into the semiconductor epitaxial layer 32 evenly. Generally, according to different dopants and processes of the contact layer, the bandgap may be ranged from 0.5 eV to 5 eV.

Although the drawings and the illustrations shown above are corresponding to the specific embodiments individually, the element, the practicing method, the designing principle, and the technical theory can be referred, exchanged, incorporated, collocated, coordinated except they are conflicted, incompatible, or hard to be put into practice together. Although the present application has been explained above, it is not the limitation of the range, the sequence in practice, the material in practice, or the method in practice. Any modification or decoration for present application is not detached from the spirit and the range of such.

What is claimed is:

1. An optoelectronic device, comprising:
  a semiconductor stack, comprising a first semiconductor layer, an active layer formed on the first semiconductor layer, and a second semiconductor layer on the active layer;
  a first metal layer formed on a top surface of the second semiconductor layer;
  a third metal layer formed on the first metal layer;
  a fourth metal layer comprises one portion directly formed on a top surface of the first semiconductor layer; and
  an insulative layer directly formed on the top surface of the first semiconductor layer and the top surface of the second semiconductor layer;
  wherein the first metal layer comprises a first top surface, and the insulative layer comprises a third top surface on the second semiconductor layer and a fourth top surface on the first semiconductor layer,
  wherein a first height difference between a height from the first top surface of the first metal layer to the top surface of the second semiconductor layer and a height from the third top surface of the insulative layer to the top surface of the second semiconductor layer is less than 1 μm,
  wherein the fourth metal layer comprises another one portion directly formed on the third top surface of the insulative layer;
  wherein a height difference is between a top surface of the one portion and a top surface of the another one portion of the fourth metal layer, the top surface of the one portion of the fourth metal layer is exposed by the another one portion of the fourth metal layer; and
  wherein a first distance is between a top surface of the third metal layer and the top surface of the first semiconductor layer, a second distance is between the top surface of the another one portion of the fourth metal layer and the top surface of the first semiconductor layer, and a difference between the first distance and the second distance is less than 1 μm.

2. The optoelectronic device of claim 1, further comprising:
  a second metal layer formed between the fourth metal layer and the first semiconductor layer, wherein the second metal layer comprises a second top surface, a second height difference between a height from the second top surface of the second metal layer to the top surface of the first semiconductor layer and a height from the fourth top surface of the insulative layer to the top surface of the first semiconductor layer is less than 1 μm.

3. The optoelectronic device of claim 1, wherein the insulative layer is formed under the third metal layer.

4. The optoelectronic device of claim 1, wherein the first metal layer comprises multiple layers.

5. The optoelectronic device of claim 1, wherein a space between a sidewall of the first metal layer and a sidewall of the insulative layer is less than 3 μm.

6. The optoelectronic device of claim 1, wherein the third metal layer is formed between a sidewall of the first metal layer and a sidewall of the insulative layer.

7. The optoelectronic device of claim 6, wherein the first metal layer is covered by the third metal layer.

8. The optoelectronic device of claim 2, wherein a space between a sidewall of the second metal layer and a sidewall of the insulative layer is less than 3 μm.

* * * * *